(12) United States Patent
Beltran Lizarraga et al.

(10) Patent No.: US 9,450,541 B2
(45) Date of Patent: Sep. 20, 2016

(54) SYSTEMS AND METHODS RELATED TO LINEAR AND EFFICIENT BROADBAND POWER AMPLIFIERS

(71) Applicant: SKYWORKS SOLUTIONS, INC., Woburn, MA (US)

(72) Inventors: Ramon Antonio Beltran Lizarraga, Thousand Oaks, CA (US); Aleksey A. Lyalin, Moorpark, CA (US); Russ Alan Reisner, Newbury Park, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/797,254

(22) Filed: Jul. 13, 2015

(65) Prior Publication Data

US 2016/0164474 A1 Jun. 9, 2016

Related U.S. Application Data

(60) Provisional application No. 61/992,842, filed on May 13, 2014.

(51) Int. Cl.
| | |
|---|---|
| *H03F 3/68* | (2006.01) |
| *H03F 1/32* | (2006.01) |
| *H03F 3/19* | (2006.01) |
| *H03F 3/21* | (2006.01) |
| *H03F 1/02* | (2006.01) |
| *H04B 1/04* | (2006.01) |

(52) U.S. Cl.
CPC .......... *H03F 1/3217* (2013.01); *H03F 1/0288* (2013.01); *H03F 3/19* (2013.01); *H03F 3/211* (2013.01); *H04B 1/0475* (2013.01); *H03F 2200/09* (2013.01); *H04B 2001/0408* (2013.01)

(58) Field of Classification Search
CPC ............... H04B 1/0475; H04B 2001/0408; H03F 2200/09; H03F 1/3217; H03F 3/19; H03F 3/211; H03F 1/0288
See application file for complete search history.

(56) References Cited

U.S. PATENT DOCUMENTS

| | | | |
|---|---|---|---|
| 6,320,462 B1 | 11/2001 | Alley | |
| 8,340,606 B2 * | 12/2012 | Park | H04B 1/04 375/285 |

(Continued)

FOREIGN PATENT DOCUMENTS

KR 1020050031663 A 4/2005

OTHER PUBLICATIONS

International Search Report and Written Opinion for PCT/US2015/040098 dated Nov. 24, 2015.

*Primary Examiner* — Dac Ha
(74) *Attorney, Agent, or Firm* — Chang & Hale LLP

(57) ABSTRACT

Systems and methods related to linear and efficient broadband power amplifiers. A power amplifier (PA) system can include an input circuit configured to receive a radio-frequency (RF) signal and split the RF signal into a first portion and a second portion. The PA system can further include a Doherty amplifier circuit including a carrier amplification path coupled to the input circuit to receive the first portion and a peaking amplification path coupled to the input circuit to receive the second portion. The PA system can further include an output circuit coupled to the Doherty amplifier circuit. The output circuit can include a balance to unbalance (BALUN) circuit configured to combine outputs of the carrier amplification path and the peaking amplification path to yield an amplified RF signal.

20 Claims, 10 Drawing Sheets

(56) References Cited

U.S. PATENT DOCUMENTS

| | | | |
|---|---|---|---|
| 8,837,629 B2* | 9/2014 | Ghannouchi | H03F 1/0288 330/124 R |
| 8,928,404 B2* | 1/2015 | Khanifar | H03F 1/0288 330/124 R |
| 9,083,284 B2* | 7/2015 | Maslennikov | H03F 1/0288 |
| 9,225,291 B2* | 12/2015 | Ahmed | H03F 1/0233 |
| 2002/0102971 A1* | 8/2002 | Jayaraman | H03F 1/0205 455/127.2 |
| 2002/0186079 A1 | 12/2002 | Kobayashi | |
| 2011/0158081 A1 | 6/2011 | Wang et al. | |
| 2011/0182319 A1* | 7/2011 | Hua | H01S 3/134 372/55 |
| 2013/0027272 A1 | 1/2013 | Karthaus | |
| 2015/0002227 A1* | 1/2015 | Pribble | H03F 1/56 330/295 |

\* cited by examiner

SYSTEMS AND METHODS RELATED TO LINEAR AND EFFICIENT BROADBAND POWER AMPLIFIERS

CROSS-REFERENCE TO RELATED APPLICATION(S)

This application claims priority to U.S. Provisional Application No. 61/992,842 filed May 13, 2014, entitled SYSTEMS AND METHODS RELATED TO LINEAR AND EFFICIENT BROADBAND POWER AMPLIFIERS, the disclosure of which is hereby expressly incorporated by reference herein in its entirety.

BACKGROUND

1. Field

The present disclosure generally relates to radio-frequency (RF) power amplifiers (PAs).

2. Description of the Related Art

Traditionally, it has been widely believed that the Doherty PA was not suitable for linear PA applications in handsets due to the size, complexity, and non-linear behavior. In fact, in base station applications, predistortion linearizers are typically used with Doherty PAs to meet linearity requirements. As described herein, issues such as size, complexity, and linearity associated with Doherty PAs can be addressed appropriately.

SUMMARY

In accordance with some implementations, the present disclosure relates to a power amplifier (PA) system including an input circuit configured to receive a radio-frequency (RF) signal and split the RF signal into a first portion and a second portion, a Doherty amplifier circuit including a carrier amplification path coupled to the input circuit to receive the first portion and a peaking amplification path coupled to the input circuit to receive the second portion, and an output circuit coupled to the Doherty amplifier circuit. The output circuit can include a balance to unbalance (BALUN) circuit configured to combine outputs of the carrier amplification path and the peaking amplification path to yield an amplified RF signal.

In some embodiments, the PA system can further include a pre-driver amplifier configured to partially amplify the RF signal before reception by the input circuit. In some embodiments, at least one of the input circuit and the output circuit can be implemented as a lumped-element circuit.

In some embodiments, the carrier amplification path can include a carrier amplifier and the peaking amplification path can include a peaking amplifier, each of the carrier amplifier and the peaking amplifier including a driver stage and an output stage. In some embodiments, the input circuit can include a modified Wilkinson power divider configured to provide DC power to each of the carrier amplifier and the peaking amplifier. In some embodiments, the DC power can be provided to the carrier amplifier and the peaking amplifier through a choke inductance. In some embodiments, each of the carrier amplification path and the peaking amplification path includes a DC blocking capacitance. In some embodiments, the modified Wilkinson power divider can be further configured to provide impedance matching between the driver stages and the pre-driver amplifier. In some embodiments, each of the carrier amplification path and the peaking amplification path can include an LC matching circuit having a capacitance along the path and an inductive coupling to ground.

In some embodiments, the modified Wilkinson power divider can be configured to provide a desired phase shifting to compensate or tune for an AM-PM effect associated with the peaking amplifier. In some embodiments, the modified Wilkinson power divider can be further configured to provide a desired attenuation adjustment at an input of either the carrier amplifier or the peaking amplifier to compensate or tune for an AM-AM effect associated with the carrier amplifier and the peaking amplifier. In some embodiments, the modified Wilkinson power divider includes a capacitance that couples a first node along the carrier amplification path to a ground, and an impedance that couples a second node along the peaking amplification path to the ground. In some embodiments, the modified Wilkinson power divider can further include an isolation resistance implemented between the first node and the second node, the isolation resistance selected to prevent or reduce a source-pulling effect between the carrier amplification path and the peaking amplification path.

In some embodiments, the BALUN circuit can include an LC BALUN transformer. In some embodiments, the peaking amplifier can be configured to behave as a short circuit or a low impedance node when in an off state, and the carrier amplifier can be configured to behave as a single-ended amplifier equivalent to that of a single-section matching network having a series inductance and a shunt capacitance when utilizing the LC BALUN transformer. In some embodiments, the LC BALUN transformer can be configured such that an impedance seen by the carrier amplifier is increased when in a low power mode. In some embodiments, the impedance seen by the carrier amplifier is approximately doubled when in the low power mode.

In some embodiments, the peaking amplifier can be further configured to operate in a similar manner as a push-pull amplifier where an RF current from the carrier amplifier is influenced by an RF current from the peaking amplifier. In some embodiments, the push-pull operation can reduce even-harmonics thereby improving linearity.

In some embodiments, the LC BALUN transformer can include a first path that couples an output of the carrier amplifier to an output node, and a second path that couples an output of the peaking amplifier to the output node. In some embodiments, each of the first path and the second path can be inductively coupled to a DC port to provide a DC feed to the output stage. In some embodiments, each of the first path and the second path can include a harmonic trap. In some embodiments, the harmonic trap can include a second harmonic trap having an LC shunt to ground and a series inductance. In some embodiments, the second path can include a shunt capacitance and a series capacitance configured to provide phase compensation for the output of the peaking amplifier. In some embodiments, at least one of the shunt capacitance and the series capacitance can be a surface-mount technology (SMT) capacitor.

In some embodiments, the LC BALUN transformer can be configured to provide reduced loss in the carrier amplification path to maintain high efficiency at back-off and in a high power mode.

In some embodiments, load modulation of the peaking amplifier can be configured such that an impedance loci for the peaking amplifier run from an approximately short circuit when the peaking amplifier is in an off state to an optimum load impedance when the peaking amplifier is contributing approximately same power as the carrier amplifier.

In some embodiments, the input circuit can be a broadband circuit at least in part due to a lead-lag network configured to provide broadband phase shift.

In some embodiments, the input circuit is configured to provide reactive to real impedance matching, and isolation between the carrier amplifier and peaking amplifier, while providing broadband performance.

In some implementations, the present disclosure relates to a method for amplifying a radio-frequency (RF) signal, the method including providing a Doherty amplifier circuit having a carrier amplification path and a peaking amplification path, receiving an RF signal, splitting the RF signal into a first portion and a second portion, the first portion provided to the carrier amplification path, the second portion provided to the peaking amplification path, and combining, using a balance to unbalance (BALUN) circuit, outputs of the carrier amplification path and the peaking amplification path to yield an amplified RF signal.

In some implementations, the present disclosure relates to a power amplifier module. The power amplification module can include a packaging substrate configured to receive a plurality of components and a power amplifier (PA) system implemented on the packaging substrate. The PA system can include an input circuit configured to receive the RF signal and split the RF signal into a first portion and a second portion. The PA system can further include a Doherty amplifier circuit having a carrier amplification path coupled to the input to receive the first portion and a peaking amplification path coupled to the input circuit to receive the second portion. The PA system can further include an output circuit coupled to the Doherty amplifier circuit. The output circuit can include a balance to unbalance (BALUN) circuit configured to combine outputs of the carrier amplification path and the peaking amplification path to yield an amplified RF signal. The power amplification module can further include a plurality of connectors configured to provide electrical connections between the PA system and the packaging substrate.

In some implementations, the present disclosure relates to a wireless device including a transceiver configured to generate a radio-frequency signal, a power amplification (PA) module in communication with the transceiver, and an antenna in communication with the PA module, the antenna configured to facilitate transmission of the amplified RF signal. The PA module can include an input circuit configured to receive the RF signal and split the RF signal into a first portion and a second portion. The PA module can further include a Doherty amplifier circuit having a carrier amplification path coupled to the input circuit to receive the first portion and a peaking amplification path coupled to the input circuit to receive the second portion. The PA module can further include an output circuit coupled to the Doherty amplifier circuit. The output circuit can include a balance to unbalance (BALUN) circuit configured to combine outputs of the carrier amplification path and the peaking amplification path to yield an amplified RF signal. The transceiver can further include an antenna, in communication with the PA module, configured to facilitate transmission of the amplified RF signal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

The present disclosure relates to U.S. patent application No. Ser. 14/797,275, entitled SYSTEMS AND METHODS RELATED TO LINEAR LOAD MODULATED POWER AMPLIFIERS, and U.S. patent application No. Ser. 14/797,261, entitled CIRCUITS, DEVICES AND METHODS RELATED TO COMBINERS FOR DOHERTY POWER AMPLIFIERS, filed on Jul. 13, 2015, and hereby incorporated by reference herein in their entirety.

DETAILED DESCRIPTION OF SOME EMBODIMENTS

The headings provided herein, if any, are for convenience only and do not necessarily affect the scope or meaning of the claimed invention.

Figure 1:
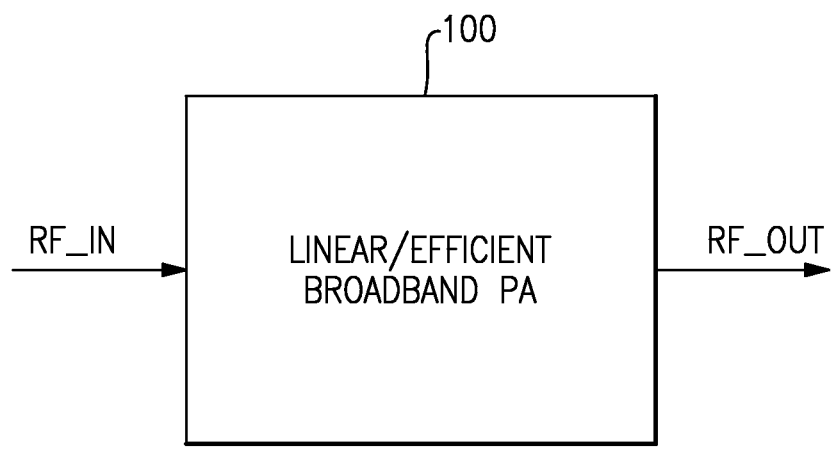
FIG. 1 shows that in some embodiments, a power amplifier can be implemented as a linear and efficient broadband power amplifier.

Described herein are systems, devices, circuits and methods related to radio-frequency (RF) power amplifiers (PAs). FIG. 1 shows that in some embodiments, a PA 100 having one or more features as described herein can be configured to provide broadband capability with either or both of desirable linearity and efficiency. The PA 100 is shown to receive an RF signal (RF_IN) and generate an amplified signal (RF_OUT). Various examples related to such a PA are described herein in greater detail.

Figure 2:
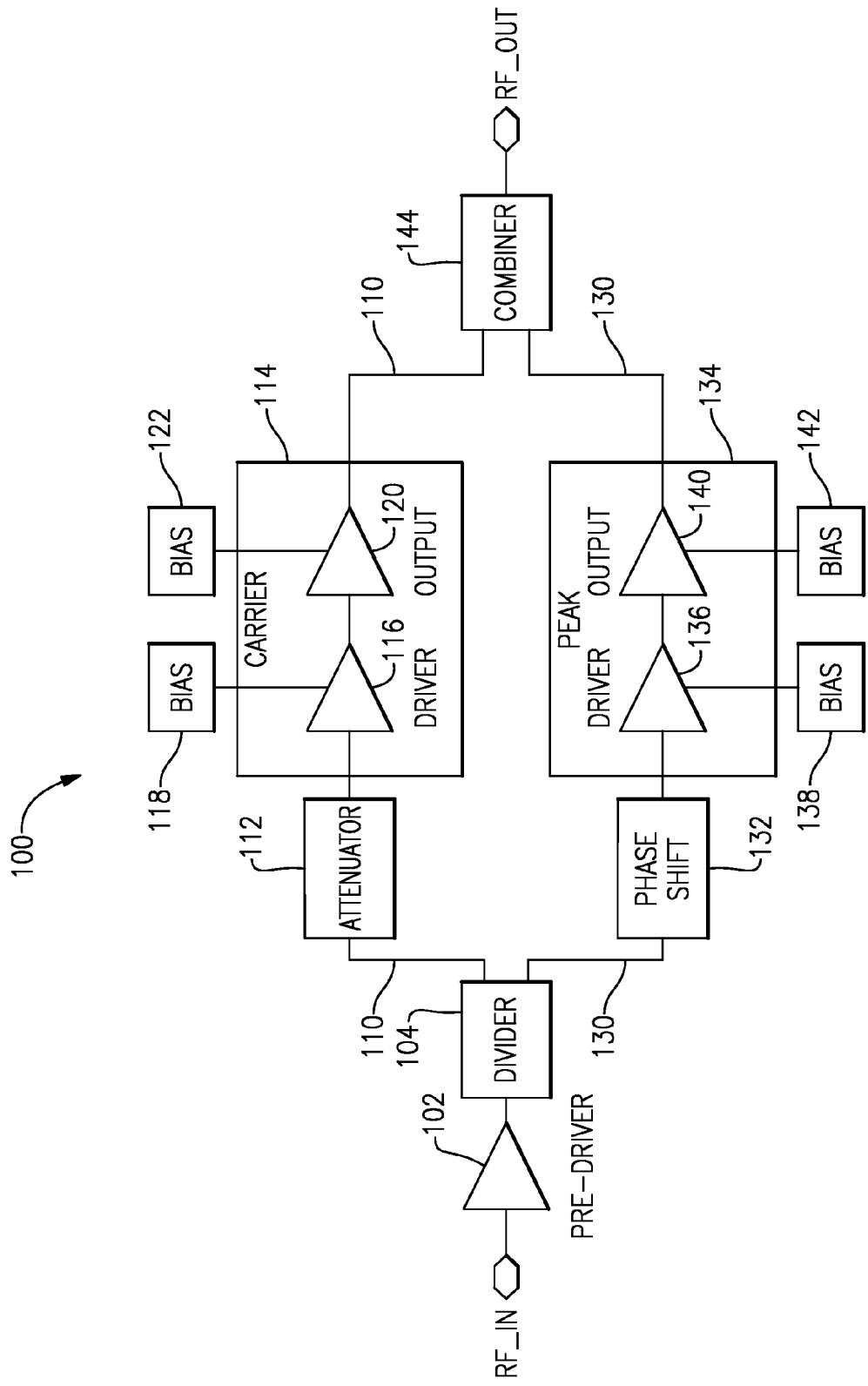
FIG. 2 shows an example architecture of a power amplifier including a carrier amplification path and a peaking amplification path.

FIG. 2 shows an example architecture of a PA 100 having one or more features as described herein. The architecture shown is a Doherty PA architecture. Although the various examples are described in the context of such a Doherty PA architecture, it will be understood that one or more features of the present disclosure can also be implemented in other types of PA systems.

The example PA 100 is shown to include an input port (RF_IN) for receiving an RF signal to be amplified. Such an input RF signal can be partially amplified by a pre-driver amplifier 102 before being divided into a carrier amplification path 110 and a peaking amplification path 130. Such a division can be achieved by a divider 104. Examples related to the divider 104 are described herein in greater detail, including examples in reference to FIGS. 3 and 7.

In FIG. 2, the carrier amplification path 110 is shown to include an attenuator 112 and amplification stages collectively indicated as 114. The amplification stages 114 are shown to include a driver stage 116 and an output stage 120. The driver stage 116 is shown to be biased by a bias circuit 118, and the output stage 120 is shown to be biased by a bias circuit 122. In some embodiments, there may be more or less number of amplification stages. In various examples described herein, the amplification stages 114 are sometimes described as an amplifier; however, it will be understood that such an amplifier can include one or more stages.

In FIG. 2, the peaking amplification path 130 is shown to include phase shifting circuit 132 and amplification stages collectively indicated as 134. The amplification stages 134 are shown to include a driver stage 136 and an output stage 140. The driver stage 136 is shown to be biased by a bias circuit 138, and the output stage 140 is shown to be biased by a bias circuit 142. In some embodiments, there may be more or less number of amplification stages. In various examples described herein, the amplification stages 134 are sometimes described as an amplifier; however, it will be understood that such an amplifier can include one or more stages.

FIG. 2 further shows that the carrier amplification path 110 and the peaking amplification path 130 can be combined by a combiner 144 so as to yield an amplified RF signal at an output port (RF_OUT). Examples related to the combiner 144 are described herein in greater detail, including examples in reference to FIGS. 4 and 7.

Figure 3:
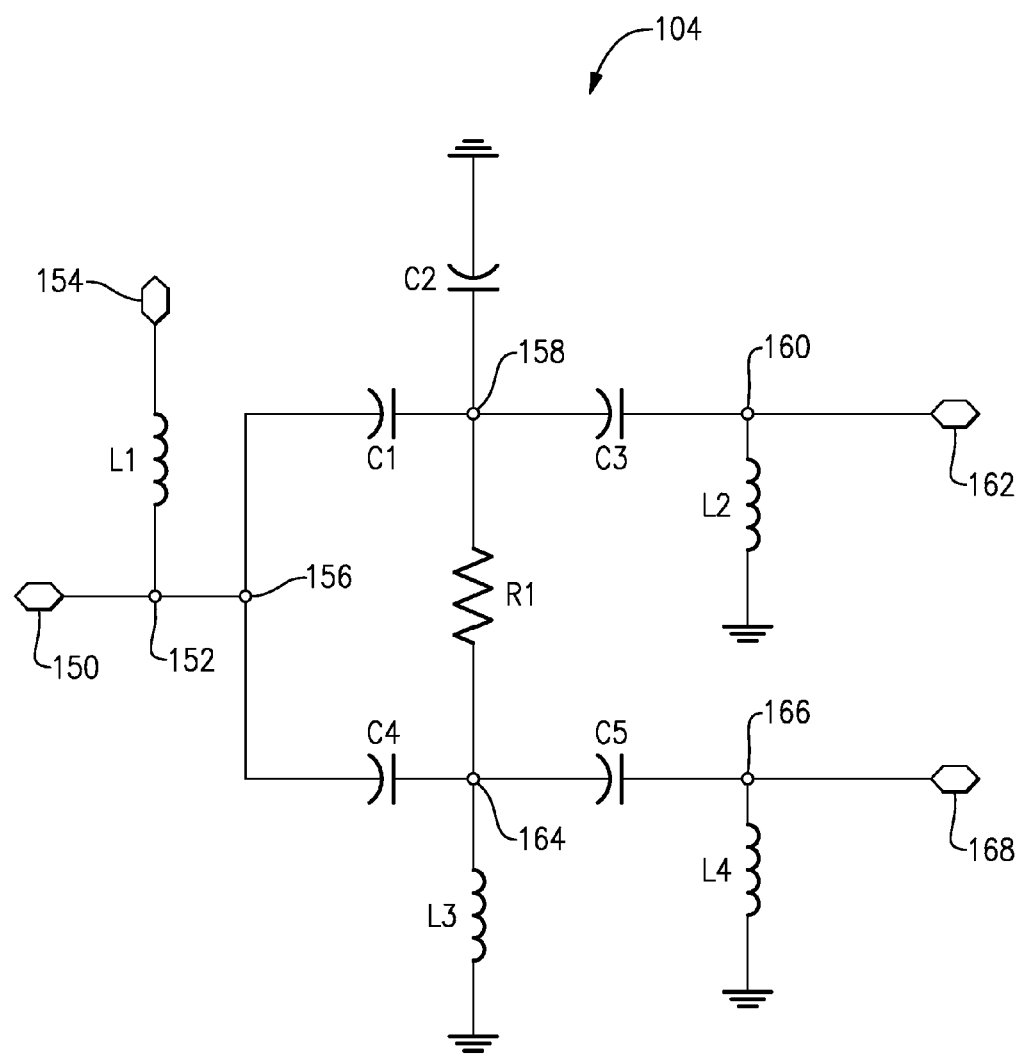
FIG. 3 shows an example configuration of a modified Wilkinson-type power divider.
Figure 7:
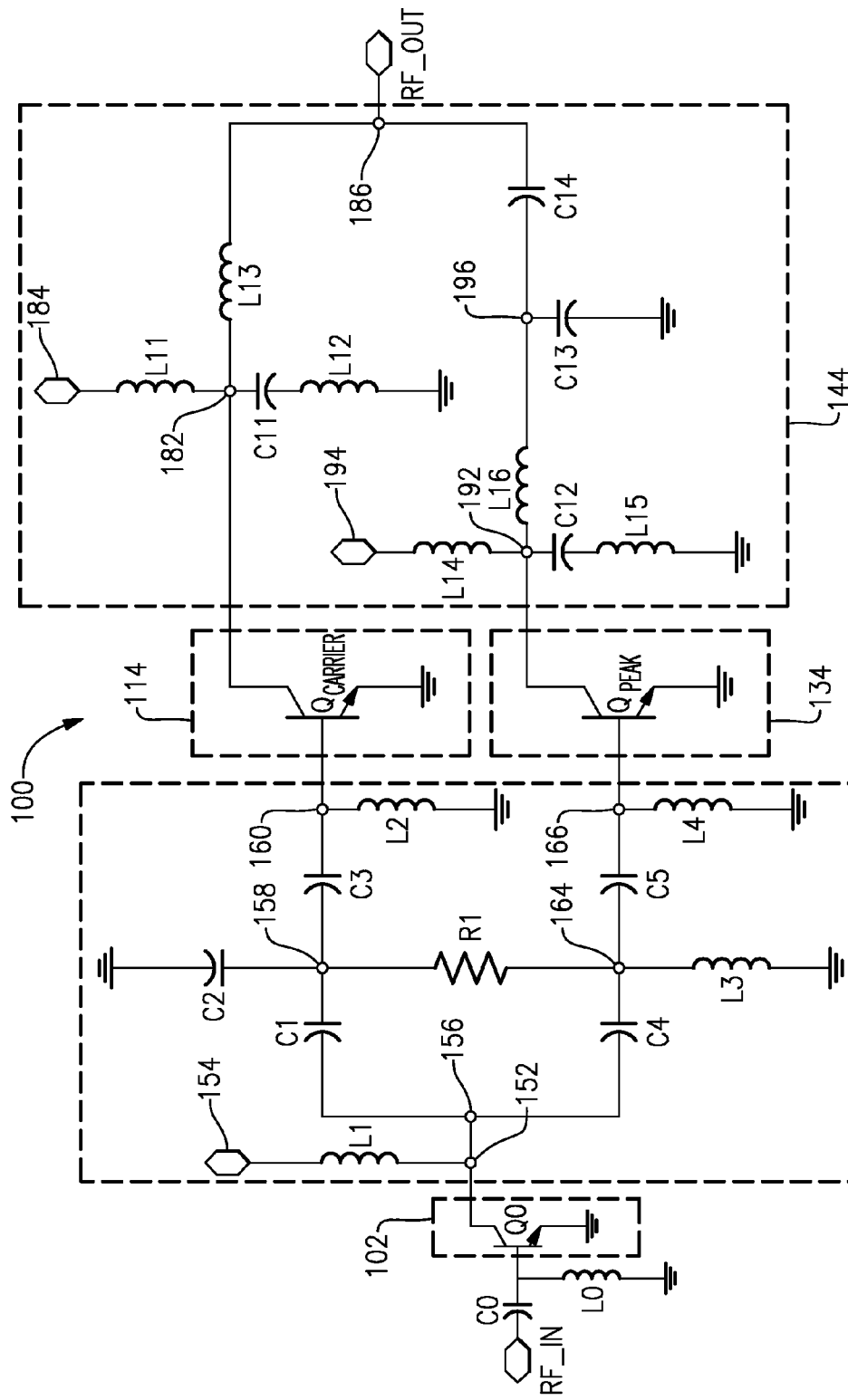
FIG. 7 shows an example configuration of a power amplifier including a modified Wilkinson-type power divider.

In some embodiments, the divider 104 of FIG. 2 can be implemented as a lumped-element power splitter. Such a power splitter can be implemented as a modified Wilkinson-type power divider configured to provide DC power to each of the driver stages (e.g., 116, 136 in FIG. 2). FIG. 3 shows an example configuration of a modified Wilkinson-type power divider 104 that can be implemented as the divider 104 of FIG. 2. FIG. 7 shows an example of how the modified Wilkinson-type power divider 104 can be implemented in a circuit example of the PA 100 of FIG. 2.

In FIG. 3, the modified power divider 104 is shown to include an input port 150 configured to receive an input RF signal. As shown in the example PA circuit 100 of FIG. 7, the input port 150 can be coupled to a collector of a transistor Q0 of a pre-driver amplifier 102. The input port 150 is further shown to be coupled to a splitter node 156 through node 152. The node 152 is shown to be coupled to a DC supply port 154 through an inductance L1 (e.g., an inductor). The DC power for each of the driver stages can be obtained through the DC supply port 154. In FIG. 3, L1 can be part of the modified Wilkinson-type splitter which matches the impedance looking into the splitter to the impedance presented to the pre-driver PA collector. At the same time, L1 can serve as a DC path for the pre-driver.

In FIG. 3, the carrier amplification path (110 in FIG. 2) is shown to include a path from the splitter node 156 to node 160, through a capacitance C1, node 158, and a capacitance C3. The node 160 may or may not be connected to a port 162 to facilitate coupling of the foregoing path to a carrier amplifier (e.g., 114 in FIG. 2). The node 158 is shown to be coupled to ground through a capacitance C2. The node 160 is shown to be coupled to ground through an inductance L2.

In FIG. 3, the peaking amplification path (130 in FIG. 2) is shown to include a path from the splitter node 156 to node 166, through a capacitance C4, node 164, and a capacitance C5. The node 166 may or may not be connected to a port 168 to facilitate coupling of the foregoing path to a peaking amplifier (e.g., 134 in FIG. 2). The node 164 is shown to be coupled to ground through an inductance L3. The node 166 is shown to be coupled to ground through an inductance L4.

In FIG. 3, a resistance R1 is shown to couple the node 158 of the carrier amplification path and the node 164 of the peaking amplification path. The resistance R1 can be selected to function as an isolation resistor to prevent or reduce source-pulling effect(s) from the carrier and/or peaking amplifiers.

In FIG. 3, the capacitance C1 can be selected to provide DC blocking functionality for the carrier amplification path. Similarly, the capacitance C4 can be selected provide DC blocking functionality for the peaking amplification path.

In FIG. 3, the capacitance C3 and the inductance L2 can be selected to provide impedance matching between the pre-driver amplifier (e.g., 102 in FIGS. 2 and 7) and the carrier amplifier 114. Similarly, the C5 and the inductance L4 can be selected to provide impedance matching between the pre-driver amplifier (e.g., 102 in FIGS. 2 and 7) and the peaking amplifier 134.

In FIG. 3, the capacitance C2 associated with the carrier amplification path and the inductance L3 associated with the peaking amplification path can be selected to provide a desired phase shifting between the two paths. Such a phase shift can be selected to, for example, compensate for and/or tune AM-PM phenomena associated with the peaking amplifier 134. In FIG. 2, such a phase-shifting functionality is depicted as block 132 along the peaking amplification path 130.

In some embodiments, and as shown in FIG. 2, an attenuator 112 can be provided along either the carrier amplification path 110 (e.g., before the carrier amplifier 114) or the peaking amplification path 130 (e.g., before the peaking amplifier 134). Such an attenuator can be configured to provide a desired attenuation adjustment to compensate for and/or tune AM-AM phenomena associated with either or both of the carrier and peaking amplifiers. Such an attenuator can also promote uneven power splitting between the two amplification paths.

It is noted that the foregoing corrections and/or tuning of the AM-AM and/or AM-PM effects can result in the PA 100 of FIGS. 2 and 7 to be substantially linear. Such linearity can be achieved without requiring digital pre-distortion which typically reduces efficiency of the PA system and applicability of the PA system in amplifiers for portable wireless devices. Further, linearity achieved by the PA 100 of FIGS. 2 and 7 (without the digital pre-distortion) can be similar to linearity performance associated with a class-AB single-ended amplifier.

Figure 4:
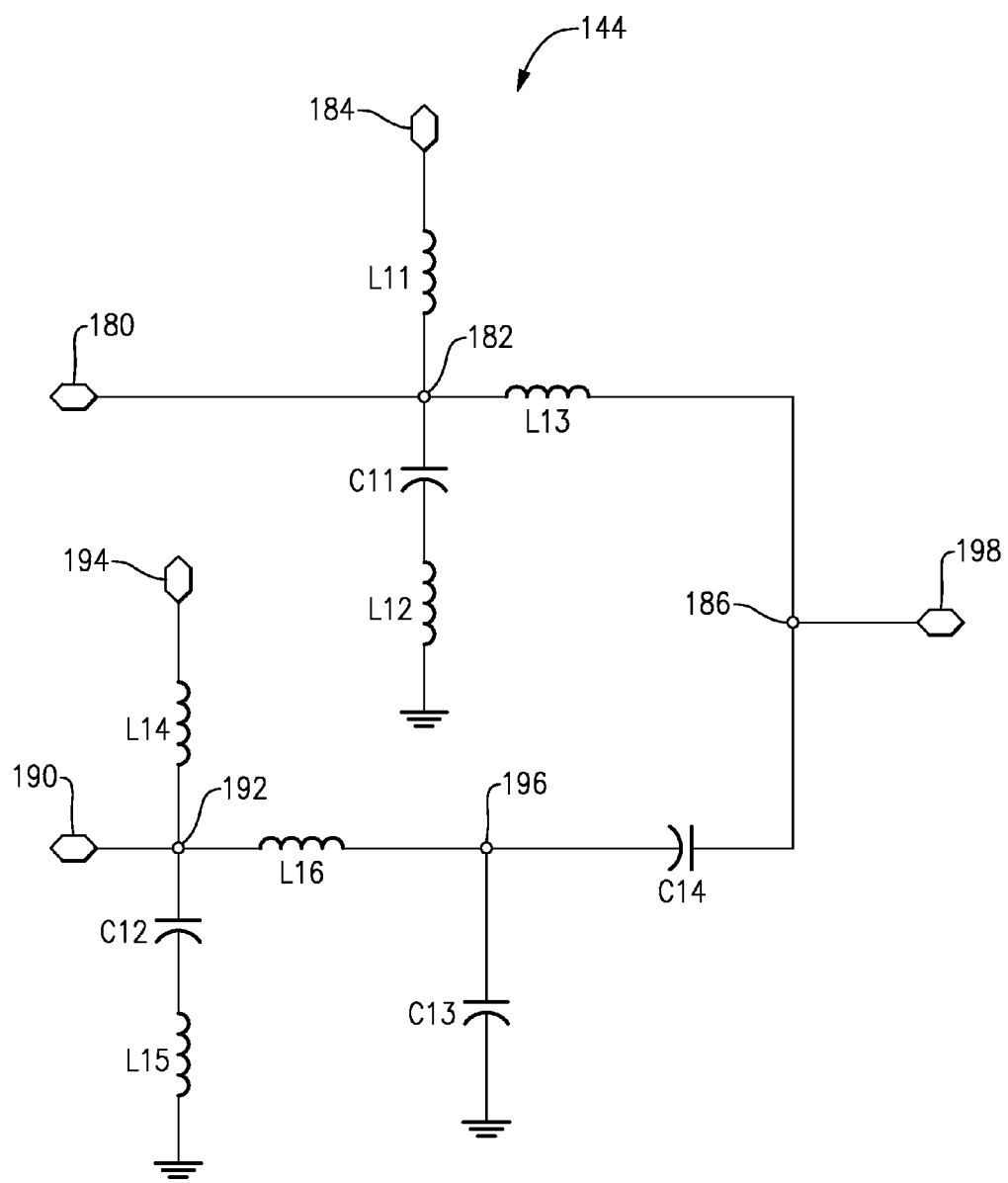
FIG. 4 shows an example configuration of a combiner that can provide balance to unbalance (BALUN) transformer functionality.

In some embodiments, the combiner 144 of FIG. 2 can be implemented as or similar to a lumped-element balanced to unbalanced (BALUN) transformer. FIG. 4 shows an example configuration of a combiner 144 that can provide such BALUN transformer functionality. FIG. 7 shows an example of how the combiner 144 can be implemented in a circuit example of the PA 100 of FIG. 2.

In FIG. 4, the combiner 144 is shown to include a portion of the carrier amplification path (e.g., 110 in FIG. 2) and a portion of the peaking amplification path (130) joined at a combining node 186. The combining node 186 is shown to be coupled to an output port 198 (RF_OUT in FIGS. 2 and 7).

In FIG. 4, the portion of the carrier amplification path is shown to couple the combining node 186 and node 182 through an inductance L13. The node 182 may or may not be connected to a port 180 to facilitate coupling of the foregoing path to a carrier amplifier (e.g., 114 in FIG. 2). The node 182 is shown to be coupled to ground through a capacitance C11 and an inductance L12. The node 182 is also shown to be coupled to a port 184 through an inductance L11.

In FIG. 4, the portion of the peaking amplification path is shown to couple the combining node 186 and node 192 through an inductance L16, node 196, and a capacitance C14. The node 192 may or may not be connected to a port 190 to facilitate coupling of the foregoing path to a peaking amplifier (e.g., 134 in FIG. 2). The node 192 is shown to be coupled to ground through a capacitance C12 and an inductance L15. The node 192 is also shown to be coupled to a port 194 through an inductance L14. The node 196 is shown to be coupled to ground through a capacitance C13.

In FIG. 4, the node 182 can be coupled to the collector of the output stage (e.g., 120 in FIG. 2) of the carrier amplifier (114) through the port 180. Accordingly, DC feed can be provided to the output stage (120) of the carrier amplifier (114) through the port 184 and the inductance L11. Similarly, the node 192 can be coupled to the collector of the output stage (e.g., 140 in FIG. 2) of the peaking amplifier (134) through the port 190. Accordingly, DC feed can be provided to the output stage (140) of the peaking amplifier (134) through the port 194 and the inductance L14.

In FIG. 4, the capacitance C11, the inductance L12, and the inductance L13 can be selected to function as a second harmonic trap for the output of the carrier amplifier (114). Similarly, the capacitance C12, the inductance L15, and the inductance L16 can be selected to function as a second harmonic trap for the output of the peaking amplifier (134).

In FIG. 4, the capacitance C13 and the capacitance C14 can be selected to provide phase compensation for the output of the peaking amplifier (134). In some embodiments, C13 and C14 can be implemented as surface-mount technology (SMT) capacitors. In such embodiments, using as little as two SMT capacitors, the combiner 144 can be implemented as a broadband power combiner.

The example combiner 144 of FIG. 4 can provide desirable functionalities for operations of Doherty PA architectures. For example, the peaking amplifier in a Doherty PA architecture is typically required to behave as a short circuit or a very low impedance path when it is turned off, and the carrier amplifier typically acts as a single-ended amplifier with an equivalent circuit that is similar to or the same as a typical single-section matching network (e.g., series L and shunt C) when using an LC BALUN configuration. In such a state, impedance seen by the carrier amplifier can be doubled.

When the peaking amplifier is turned on, the PA system can operate in a manner similar to a "push-pull" amplifier. For example, the RF current from the carrier amplifier can see the current from the peaking amplifier. In such a state, linearity can be improved since the even harmonic content can be reduced.

As described herein, the combiner 144 with the example LC BALUN configuration can be implemented in a compact form, using as little as two SMT components (e.g., capacitors). Such a combiner can be configured to provide impedance matching from, for example, a 50-Ohm output to transistor-collectors of the peaking and carrier amplifiers, including RF chokes and harmonic traps.

As described herein, the combiner 144 with the example LC BALUN configuration can be implemented to reduce the loss in the carrier amplifier path compared to other Doherty topologies. Such a feature in turn can facilitate maintenance of high efficiency at back-off and high power modes. Further, the LC BALUN configuration can provide required or desired impedance and phase adjustment for the carrier amplifier. Such a feature can be important when designing an asymmetric loaded Doherty transmitter.

Figure 5:
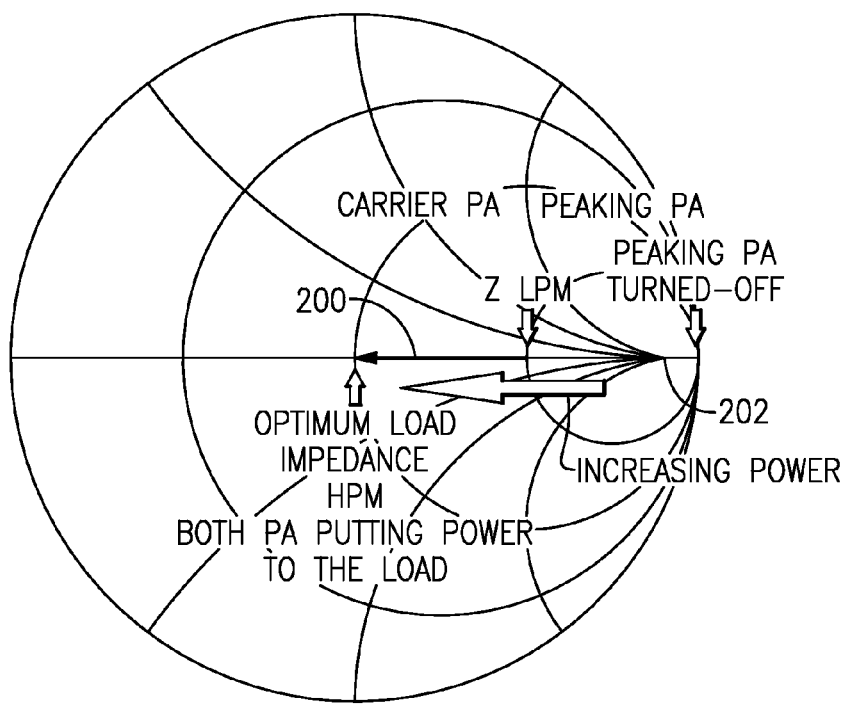
FIG. 5 shows first example load modulation profiles of a carrier amplifiers and peaking amplifier using a BALUN transformer configuration.
Figure 6:
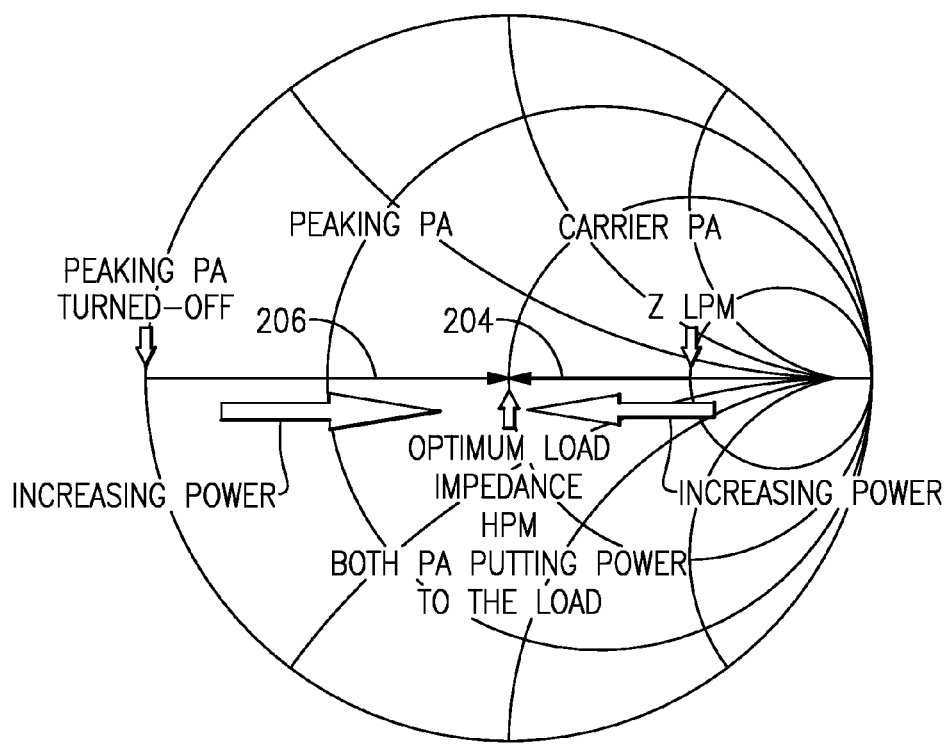
FIG. 6 shows second example load modulation profiles of a carrier amplifiers and peaking amplifier using a BALUN transformer configuration.

In some embodiments, load modulation associated with a peaking amplifier as described herein is generally opposite as in conventional Doherty transmitters. FIG. 5 shows load modulation profiles for carrier (200) and peaking (202) amplifiers of a conventional Doherty transmitter using a BALUN transformer configuration. FIG. 6 shows load modulation profiles for carrier (204) and peaking (206) amplifiers of a Doherty transmitter using a BALUN transformer configuration as described herein (e.g., FIG. 7). For the peaking amplifiers in FIGS. 5 and 6, one can see that impedance loci run in opposite directions from their respective short circuit states (e.g., when the peaking amplifier is turned off) to their respective optimum load impedance conditions (e.g., when the peaking amplifier is contributing same power as the carrier amplifier). For the conventional example of FIG. 5, the impedance loci of the peaking amplifier run in the same direction as that of the carrier amplifier as power is increased. For the example of FIG. 6, the impedance loci of the peaking amplifier run in the opposite direction as that of the carrier amplifier as power is increased.

FIG. 7 shows an example of a PA 100 having one or more features as described herein. The PA can include a pre-driver amplifier 102 such as a one-stage single-ended amplifier. The output of the pre-driver amplifier 102 is shown to be provided to a divider 104, such as the example described in reference to FIG. 3. The divided outputs of the divider 104 are shown to be provided to a carrier amplifier 114 and a peaking amplifier 134. The outputs of the carrier amplifier 114 and the peaking amplifier 134 are shown to be combined by a combiner 144, such as the example described in reference to FIG. 4.

Figure 8:
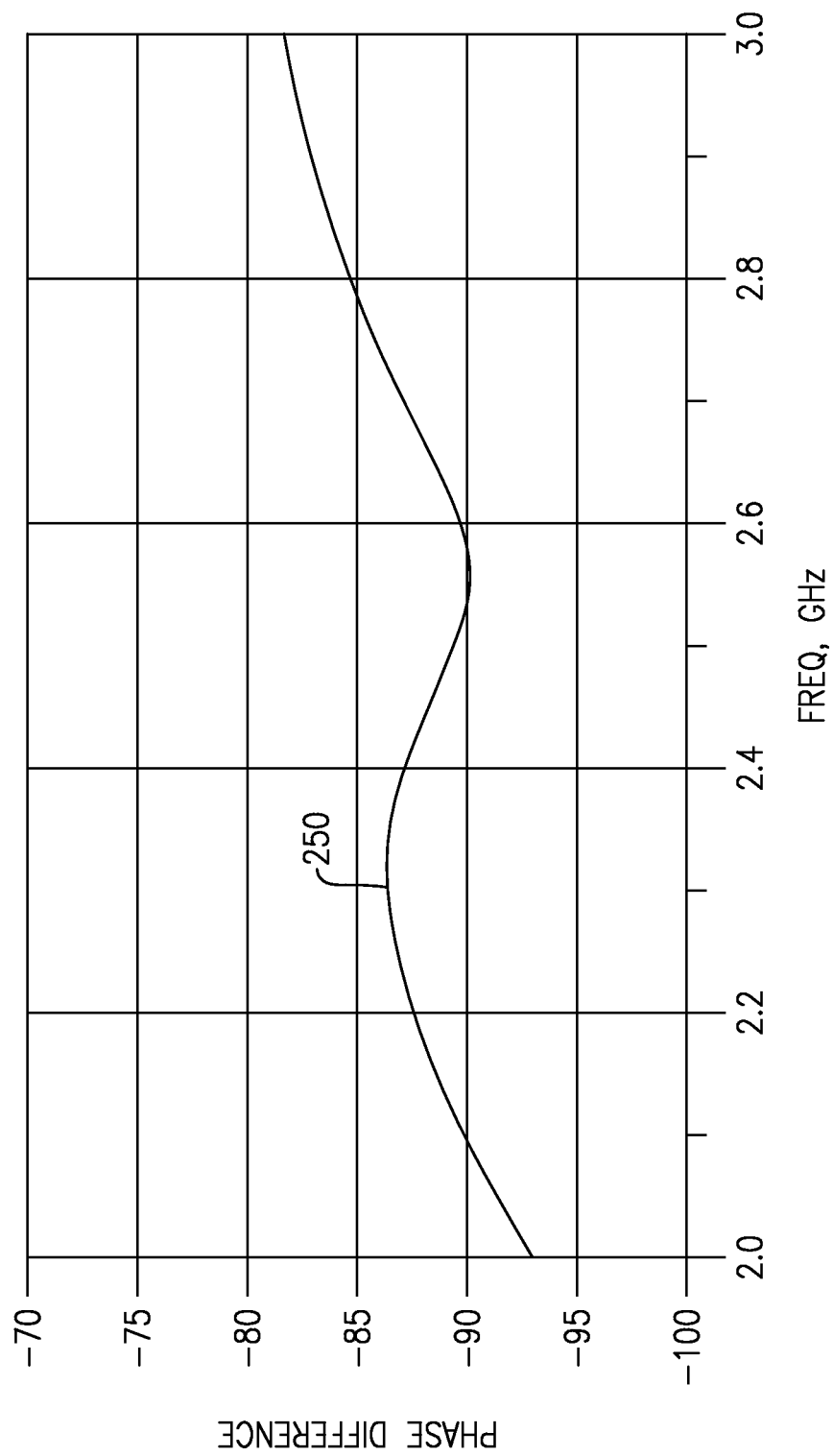
FIG. 8 shows an example broadband phase shift response.

In the example PA 100 of FIG. 7, the divider 104 and the combiner 144 can yield a broadband combination. For example, the divider 104 is broadband in nature due to, for example, the lead-lag network that provides broadband phase shift. An example of such a phase shift response is shown as curve 250 in FIG. 8. The example response curve 250 is representative of a typical phase difference between the matching reactive base impedances and the driver amplifier collector. It is further noted that the divider 104 provides advantageous features such as reactive to real impedance matching, isolation between carrier and peaking amplifiers, and still yield broadband performance.

Figure 9:
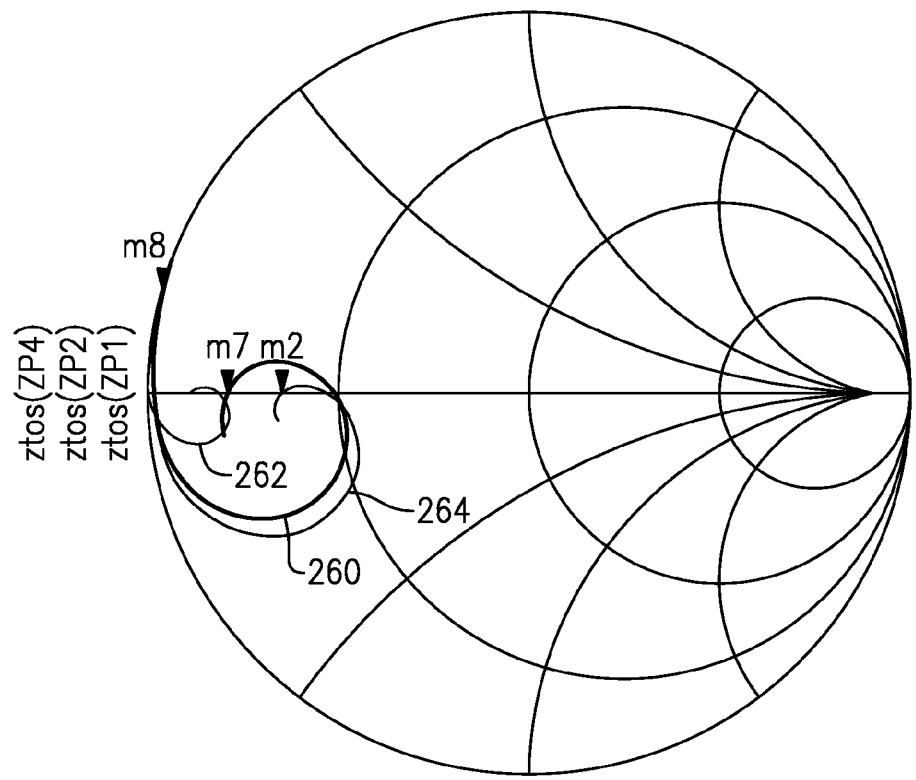
FIG. 9 shows example impedance responses including harmonic traps.

In another example, the combiner 144 with its LC BALUN configuration can also contribute to the broadband performance of the PA 100. As described herein, the LC BALUN can include harmonic traps configured to keep the impedance locus within lower constant Q circles. Example of such impedance responses are shown as curves 260, 262, 264 in FIG. 9. The example response curves 260, 262, 264 are representative of collector load impedance vs. frequency for different ZP values. ZP1 represents the load impedance seen by carrier PA collector when both carrier and peaking PAs are turned on (in operation) and it is about 5.7+j0.119 Ohms in the example. ZP2 is the collector impedance at the peaking PA collector which is similar to the previous case (e.g., same impedance when both PAs are on). ZP4 is the impedance seen by carrier PA collector when peaking PA is off which is effectively doubled to around 10.86+j0.058 Ohms in the example. Such a feature effectively enhances the PA architecture bandwidth, since the impedances vs. frequency are not spread along the Smith chart.

Figure 10:
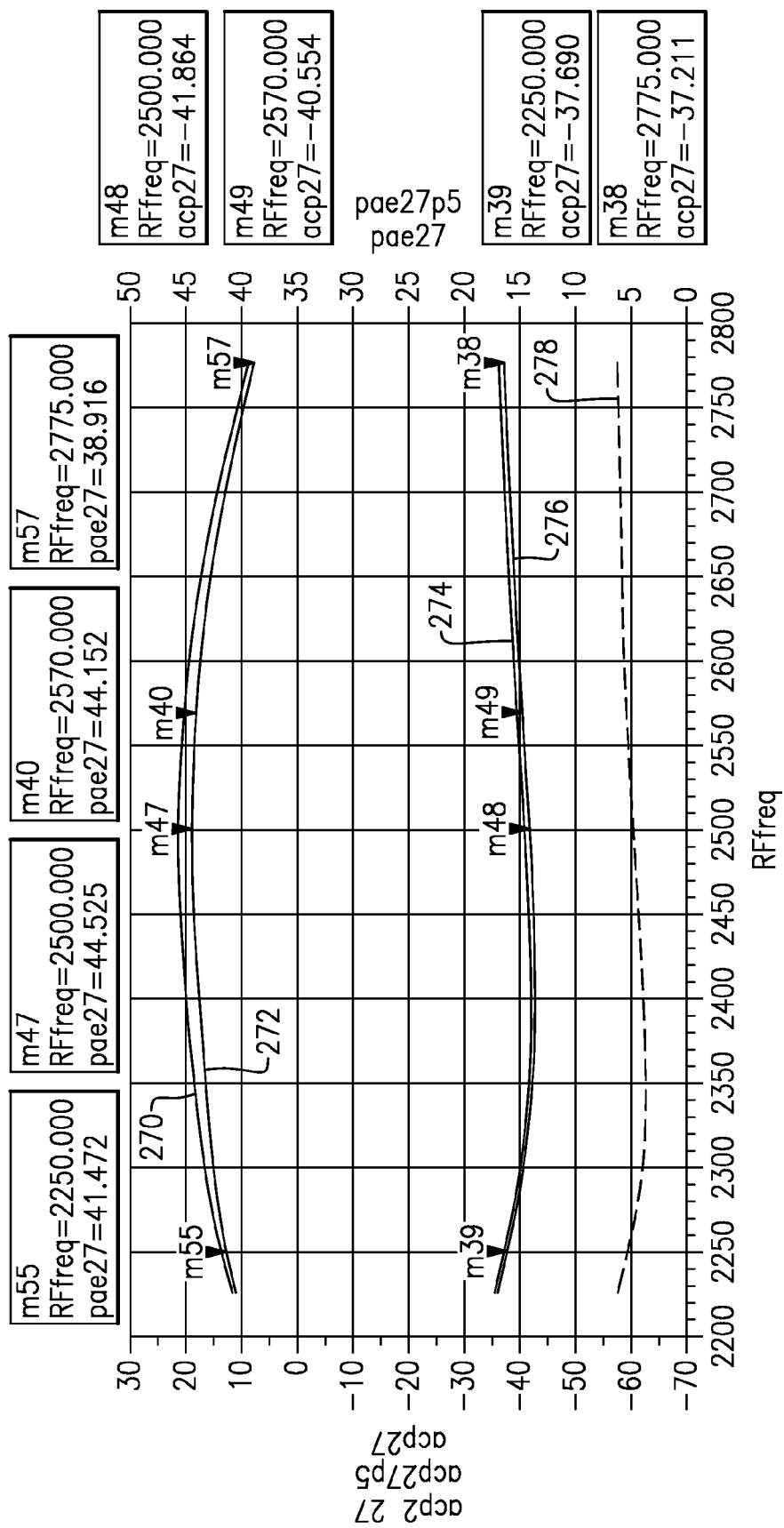
FIG. 10 shows example adjacent channel leakage-power ratio (ACLR) curves and power-added efficiency (PAE) curves.

A PA architecture having one or more features as described herein, including the examples of FIGS. 1-4 and 7, can be configured to yield excellent linear and efficient broadband performance. For example, a 21% relative bandwidth can be achieved for −37-dBc ACLR (adjacent channel leakage-power ratio) using an LTE signal (e.g., 10-MHz BW, QPSK, 12 RB). FIG. 10 shows ACLR curves and power-added efficiency (PAE) curves for different samples. The upper set of curves (270, 292) are for power added efficiency (PAE) for 27.5 and 27 dBm output power levels, respectively. The middle set of curves (274, 276) are for ACLR1 for 27.5 and 27 dBm output power levels, respectively. The dashed curve (278) is for ACLR2 for 27.5 dBm output power. In the context of ACLR performance, one can see that the −37-dBc ACLR bandwidth at 27-dBm output power is approximately 525 MHz (e.g., between markers "m39" and "m38") which is approximately 21% of the center frequency of approximately 2,500 MHz (e.g., marker "m48). It is noted that bandwidth can be even wider if the ACLR level is allowed to increase.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 11:
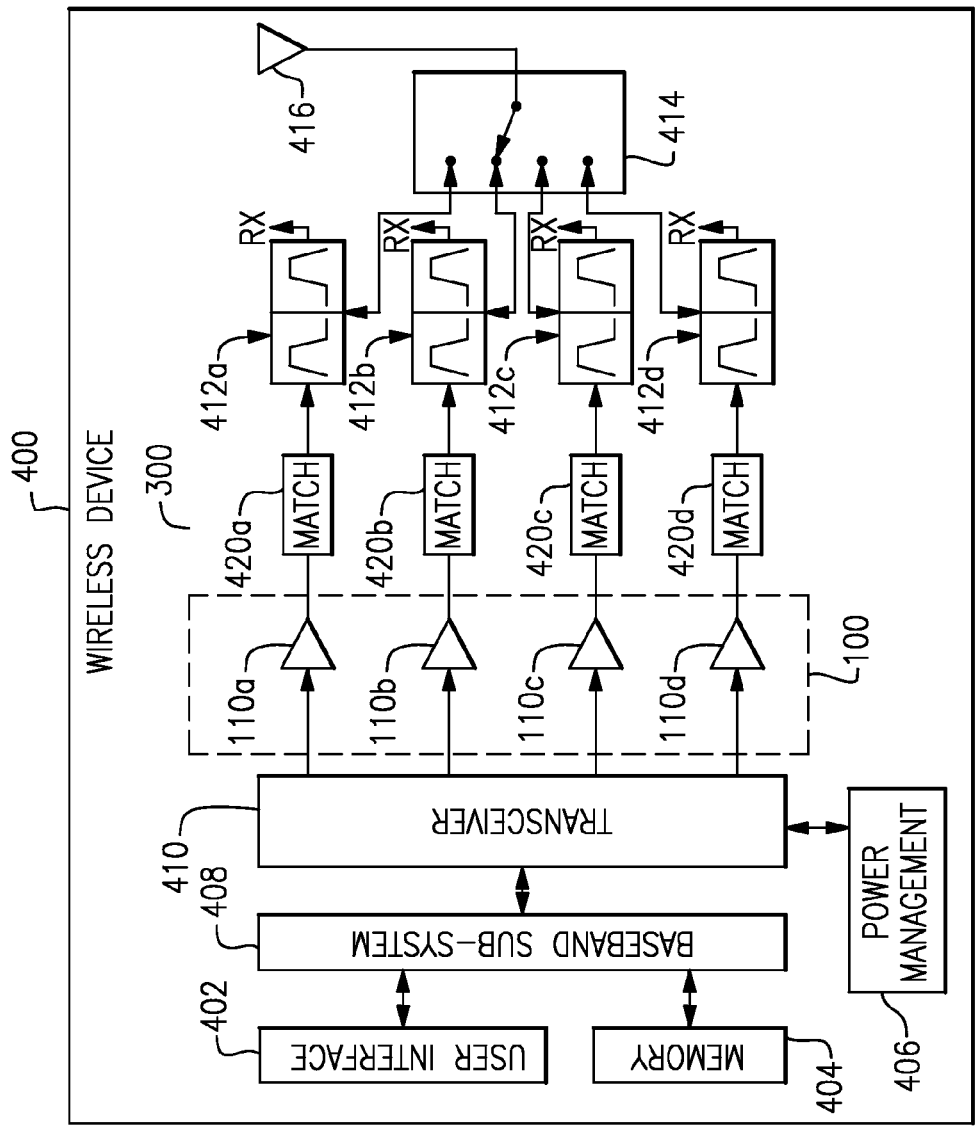
FIG. 11 depicts a wireless device having one or more features described herein.

FIG. 11 schematically depicts an example wireless device 400 having one or more advantageous features described herein. In the example, one or more PAs 110 collectively indicated as a PA architecture 100 can include one or more features as described herein. Such PAs can facilitate, for example, multi-band operation of the wireless device 400.

The PAs 110 can receive their respective RF signals from a transceiver 410 that can be configured and operated to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 is also shown to be connected to a power management component 406 that is configured to manage power for the operation of the wireless device 400. Such power management can also control operations of the baseband sub-system 408 and the Pas 110.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device 400, and/or to provide storage of information for the user.

In the example wireless device 400, outputs of the PAs 110 are shown to be matched (via match circuits 420) and routed to an antenna 416 via their respective duplexers 412a-412d and a band-selection switch 414. The band-selection switch 414 can be configured to allow selection of an operating band. In some embodiments, each duplexer 412 can allow transmit and receive operations to be performed simultaneously using a common antenna (e.g., 416). In FIG. 11, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier (PA) system comprising:
an input circuit configured to receive a radio-frequency (RF) signal at an input port and split the RF signal into a first portion and a second portion;

a Doherty amplifier circuit including a carrier amplification path coupled to the input circuit to receive the first portion and a peaking amplification path coupled to the input circuit to receive the second portion, the input circuit including an isolation resistance implemented between a first node along a first path coupling the input port to the carrier amplification path and a second node along a second path coupling the input port to the peaking amplification path, the isolation resistance being selected to prevent or reduce a source-pulling effect between the carrier amplification path and the peaking amplification path; and an output circuit coupled to the Doherty amplifier circuit, the output circuit being configured to combine outputs of the carrier amplification path and the peaking amplification path to yield an amplified RF signal.

2. The PA system of claim 1 wherein the carrier amplification path includes a carrier amplifier and the peaking amplification path includes a peaking amplifier.

3. The PA system of claim 2 further comprising a pre-driver amplifier having an output coupled to the input port.

4. The PA system of claim 3 wherein the input circuit is further configured to provide impedance matching between the carrier amplifier and the pre-driver amplifier and between the peaking amplifier and the pre-driver amplifier.

5. The PA system of claim 2 wherein the input circuit is further configured to provide a desired phase shifting to compensate or tune for an AM-PM effect associated with the peaking amplifier.

6. The PA system of claim 2 wherein the input circuit is further configured to provide a desired attenuation adjustment at an input of either or both of the carrier amplifier or the peaking amplifier to compensate or tune for an AM-AM effect associated with either or both of the carrier amplifier and the peaking amplifier.

7. The PA system of claim 2 wherein the output circuit includes an LC balun.

8. The PA system of claim 7 wherein the peaking amplifier is configured to behave as a short circuit or a low impedance node when in an off state and the carrier amplifier is configured to behave as a single-ended amplifier equivalent to that of a single-section matching network having a series inductance and a shunt capacitance when utilizing the LC balun.

9. The PA system of claim 8 wherein the LC balun is configured such that an impedance seen by the carrier amplifier is increased when in a low power mode.

10. The PA system of claim 9 wherein the impedance seen by the carrier amplifier is approximately doubled when in the low power mode.

11. The PA system of claim 8 wherein the peaking amplifier is further configured to operate in a similar manner as a push-pull amplifier where an RF current from the carrier amplifier is influenced by an RF current from the peaking amplifier.

12. The PA system of claim 11 wherein the push-pull operation reduces even-harmonics thereby improving linearity.

13. The PA system of claim 2 wherein each of a first combiner path that couples an output of the carrier amplifier to an output node and a second combiner path that couples an output of the peaking amplifier to an output node includes a harmonic trap.

14. The PA system of claim 13 wherein the harmonic trap includes a second harmonic trap having an LC shunt to ground and a series inductance.

15. The PA system of claim 2 wherein the input circuit is configured to provide DC power to each of the carrier amplifier and the peaking amplifier.

16. The PA system of claim 1 wherein the input circuit includes a modified Wilkinson power divider.

17. The PA system of claim 1 wherein the input circuit includes a first impedance that couples the first node to a ground and a second impedance that couples the second node to the ground.

18. The PA system of claim 17 wherein the first impedance includes a capacitance and the second impedance includes an inductance.

19. A power amplifier module comprising:
a packaging substrate configured to receive a plurality of components;
a power amplifier (PA) system implemented on the packaging substrate, the PA system including an input circuit configured to receive an RF signal at an input port and split the RF signal into a first portion and a second portion, the PA system further including a Doherty amplifier circuit having a carrier amplification path coupled to the input circuit to receive the first portion and a peaking amplification path coupled to the input circuit to receive the second portion, the input circuit including an isolation resistance implemented between a first node along a first path coupling the input port to the carrier amplification path and a second node along a second path coupling the input port to the peaking amplification path, the isolation resistance being selected to prevent or reduce a source-pulling effect between the carrier amplification path and the peaking amplification path, the PA system further including an output circuit coupled to the Doherty amplifier circuit, the output circuit being configured to combine outputs of the carrier amplification path and the peaking amplification path to yield an amplified RF signal; and
a plurality of connectors configured to provide electrical connections between the PA system and the packaging substrate.

20. A wireless device comprising:
a transceiver configured to generate a radio-frequency (RF) signal;
a power amplifier (PA) module in communication with the transceiver, the PA module including an input circuit configured to receive an RF signal at an input port and split the RF signal into a first portion and a second portion, the PA module further including a Doherty amplifier circuit having a carrier amplification path coupled to the input circuit to receive the first portion and a peaking amplification path coupled to the input circuit to receive the second portion, the input circuit including an isolation resistance implemented between a first node along a first path coupling the input port to the carrier amplification path and a second node along a second path coupling the input port to the peaking amplification path, the isolation resistance being selected to prevent or reduce a source-pulling effect between the carrier amplification path and the peaking amplification path, the PA module further including an output circuit coupled to the Doherty amplifier circuit, the output circuit being configured to combine outputs of the carrier amplification path and the peaking amplification path to yield an amplified RF signal; and an antenna in communication with the PA module, the antenna being configured to facilitate transmission of the amplified RF signal.

\* \* \* \* \*